(12) United States Patent
Jung

(10) Patent No.: US 7,534,549 B2
(45) Date of Patent: May 19, 2009

(54) PHOTORESIST POLYMER, AND PHOTORESIST COMPOSITION

(75) Inventor: Jae Chang Jung, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 106 days.

(21) Appl. No.: 11/312,106

(22) Filed: Dec. 20, 2005

(65) Prior Publication Data
US 2006/0273070 A1 Dec. 7, 2006

(30) Foreign Application Priority Data
Jun. 2, 2005 (KR) .................. 10-2005-0047325

(51) Int. Cl.
*G03C 1/73* (2006.01)
*G03F 7/039* (2006.01)

(52) U.S. Cl. .............. 430/270.1; 430/326; 430/907; 430/910; 526/245; 526/259; 526/262; 526/263; 526/271; 526/281

(58) Field of Classification Search .............. None
See application file for complete search history.

(56) References Cited

U.S. PATENT DOCUMENTS 6,306,555 B1 10/2001 Schulz et al.
6,312,865 B1 11/2001 Jung et al. .............. 430/270.1
2003/0091928 A1 5/2003 Choi .................. 430/270.1
2003/0157430 A1 8/2003 Yoon et al. ............. 430/270.1
2006/0127803 A1* 6/2006 Jung et al. ............. 430/270.1

FOREIGN PATENT DOCUMENTS

WO WO 02/092651 A1 11/2002
WO WO 02/093263 A1 11/2002
WO WO 03/107093 A2 12/2003

OTHER PUBLICATIONS

Translation of Office Action for corresponding Taiwan Application No. 094147301, dated May 29, 2008.

* cited by examiner

*Primary Examiner*—Sin J. Lee
(74) *Attorney, Agent, or Firm*—Marshall, Gerstein & Borun LLP

(57) ABSTRACT

A photoresist polymer comprising a fluorine component, a photoresist composition containing the photoresist polymer and an organic solvent to reduce surface tension, and a method for manufacturing a semiconductor device using the same by forming a photoresist film uniformly on the whole surface of an underlying layer pattern to allow a subsequent ion-implanting process to be performed stably.

11 Claims, 7 Drawing Sheets

PHOTORESIST POLYMER, AND PHOTORESIST COMPOSITION

BACKGROUND OF THE DISCLOSURE

1. Field of the Disclosure

The disclosure relates generally to a photoresist polymer, a photoresist composition, and a method for manufacturing a semiconductor device using the same. More specifically, the disclosure relates to a photoresist polymer containing a fluorine component, a photoresist composition containing the photoresist polymer and an organic solvent to reduce surface tension, and a method for manufacturing a semiconductor device using the same by forming a photoresist film uniformly on the whole surface of an underlying layer pattern to allow a subsequent ion-implanting process to be performed stably.

2. Description of the Related Technology

As the manufacturing technology of semiconductor devices has developed and the field of application of memory devices has been extended, technology has been urgently required to manufacture high-capacity memory devices of high integration. As a result, multilateral studies to improve a photo-lithography processes, cell structures, new materials which constitute wires, and physical property limits of materials which form insulating films have been made.

The photo-lithography process is essentially applied to form a contact hole for interconnecting various layers that constitute a device; thus, the photo-lithography process is required to be suggest to produce a high-integrated semiconductor device. Through the photolithography process, a fine pattern critical dimension (CD) of 0.01 µm or less can be formed with short wavelength light sources such as KrF(365 nm), ArF(193 nm) or VUV(157 nm) and chemically amplified photoresist materials having low light absorbance to the above light sources, excellent dry etching resistance, heat resistance and adhesive property.

Meanwhile, since the aspect ratio of the pattern has increased due to the decrease of the CD for high integration of semiconductor devices, the usage of conventional chemically amplified photoresist materials during the photolithography process results in limitations.

In other words, since the conventional chemically amplified photoresist materials have high viscosity due to high surface energy, when a photoresist film is formed on the whole surface of an underlying layer pattern having an increased aspect ratio, a photoresist material does not uniformly fill the pattern. As a result, a void is formed in the photoresist film (see FIG. 2), which damages the substrate during a subsequent ion-implanting process, which results in decrease of manufacturing yield of semiconductor devices.

FIGS. 1a through 1d are diagrams illustrating a photoresist pattern formed by using conventional chemically amplified photoresist materials and a ion-implanting process using the photoresist pattern.

Referring to FIG. 1a, an underlying layer (not shown) is formed on a semiconductor substrate 1, and etched to form an underlying layer pattern 3.

As shown in FIG. 1b, a photoresist film 5 is formed on the entire surface including the underlying layer pattern 3 of FIG. 1a with a conventional photoresist material (not shown).

An exposure and developing process is performed on the photoresist film 5 of FIG. 1b to form a photoresist pattern as shown in FIG. 1c. As a result, the photoresist pattern is formed to have an open portion 9 and a portion 5-1 filled with photoresist alternately between the underlying layer patterns 3. The void 7 remains in the filled portion 5-1.

An ion-implanting process is performed on the open portion 9 with the photoresist pattern of FIG. 1c as an ion-implanting process mask to form an ion-implanting region 11 as shown in FIG. 1d. Then, the photoresist pattern is removed to obtain the semiconductor substrate 1 where an ion-implanting region 11 is formed alternately in the underlying layer pattern.

Since the photoresist film having the void therein does not have a sufficient thickness to protect the semiconductor substrate from ion gas during the ion-implanting process, a subsequent ion-implanting process cannot be stably performed. As a result, an ion-implanting region 13 is formed in an undesired region as shown in FIG. 1d when the ion-implanting process is performed with the photoresist pattern as a mask, thereby degrading electric characteristics of the semiconductor device and reducing yield of semiconductor devices.

Moreover, voids are more generated in the photoresist film when an ultra-fine pattern having a high aspect ratio is formed with an exposer having many lens numerical apertures.

SUMMARY OF THE DISCLOSURE

Accordingly, the disclosure provides a photoresist polymer, a photoresist composition, and a method for manufacturing a semiconductor device using the same which effectively reduces the conventional defects without the development of costly equipment.

More specifically, the disclosure provides a photoresist polymer containing a fluorine component, and a photoresist composition containing the polymer with reduced surface tension.

The disclosed method for manufacturing a semiconductor device includes forming a uniform photoresist film in a space between underlying layer patterns with the disclosed photoresist composition so that a subsequent ion-implanting process can be stably performed.

BRIEF DESCRIPTION OF THE DRAWINGS

For a more complete understanding of the disclosure, reference should be made to the following detailed description and accompanying drawings.

DETAILED DESCRIPTION OF PREFERRED EMBODIMENTS

Figure 1A:
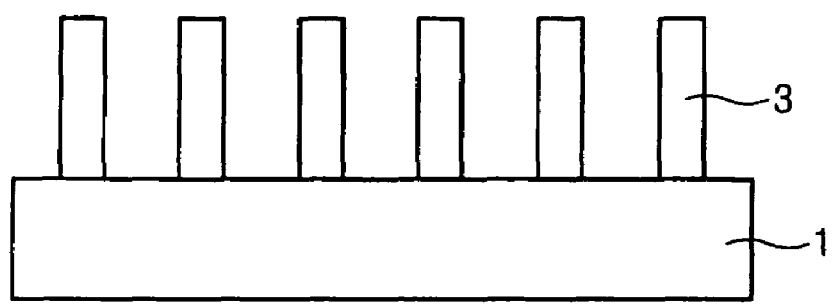
FIGS. 1a through 1d are diagrams illustrating a method for manufacturing a semiconductor device for a conventional ion-implanting process.
Figure 1B:
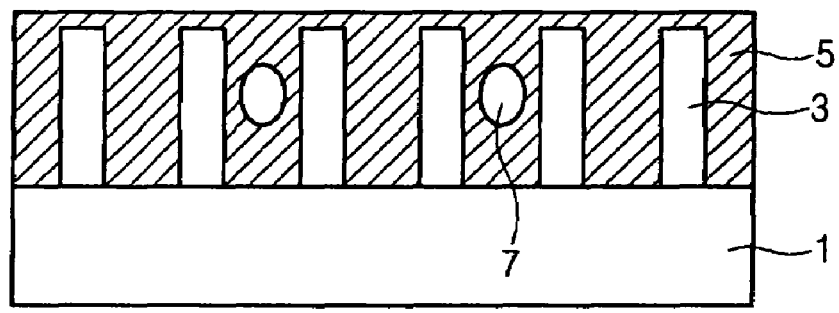
Figure 1C:
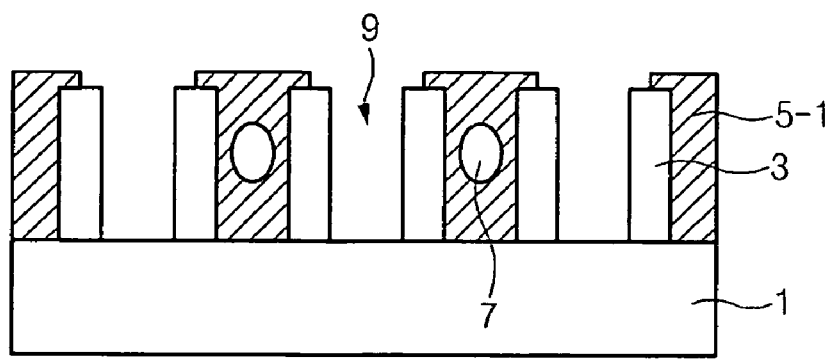
Figure 1D:
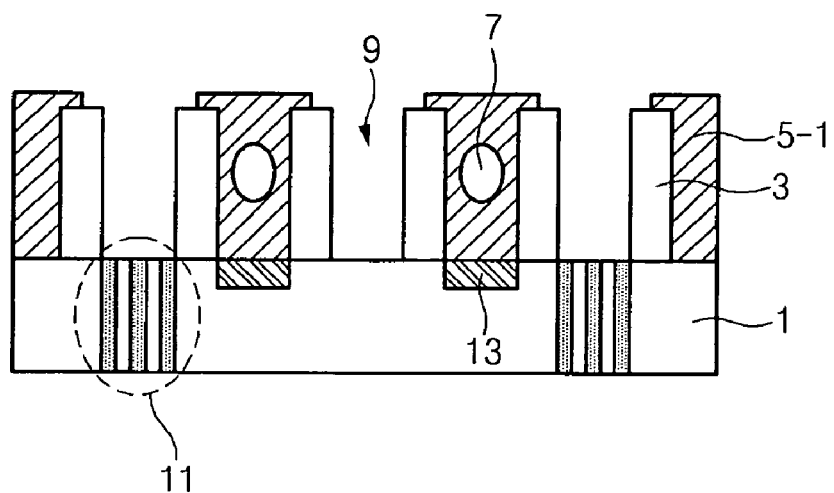
Figure 2:
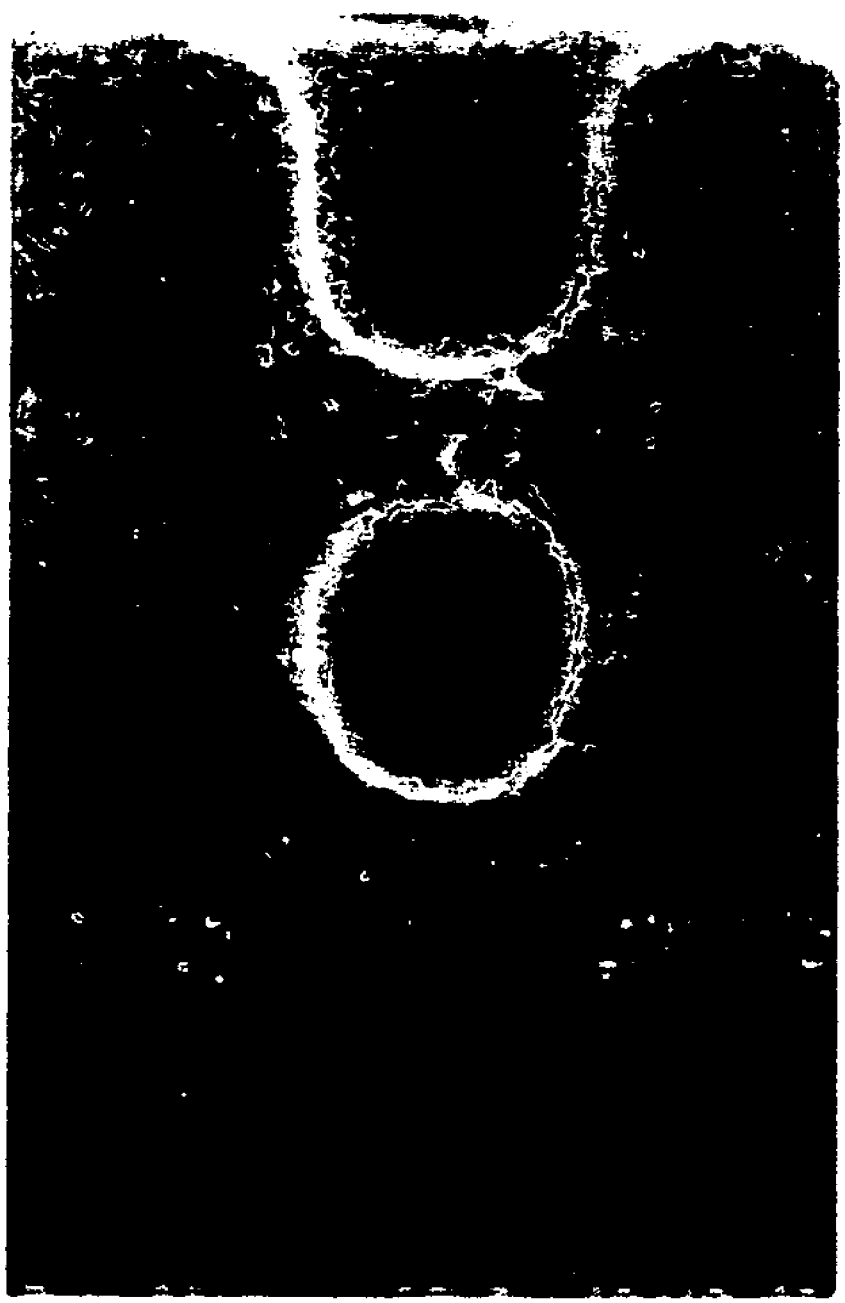
FIG. 2 is a SEM photograph illustrating a cross-section of a photoresist film having a void by the process of FIG. 1c.

A fluorine component-containing photoresist polymer comprises a polymerization repeating unit represented by Formula 1:

[Formula 1]

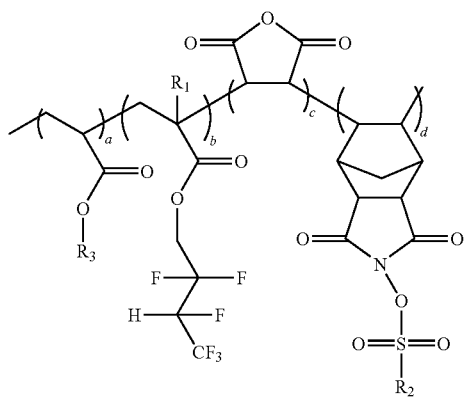

[Formula 1a]

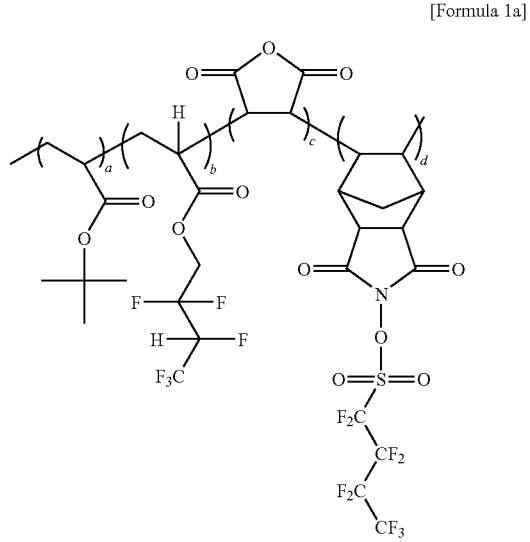

wherein $R_1$ is H or $C_1$-$C_2$ alkyl;

$R_2$ is $C_1$-$C_{10}$ perfluoroalkyl or partially F-substituted $C_1$-$C_{10}$ alkyl $R_3$ is an acid labile protecting group; and the relative ratio of a:b:c:d is 10: 10~30:2~8:2~8 by weight parts.

The acid labile protecting group means a group which can be detached by acid. When the acid labile protecting group is combined to the photoresist, it prevents the photoresist from dissolving in an alkaline developing solution. However, when the acid labile protecting group is detached by acid generated by light exposure, the photoresist may be dissolved in the alkaline developing solution.

Any of conventional acid labile protecting groups can be used. Some of them are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0 789 278 (Aug. 13, 1997), U.S. Pat. No. 5,750,680 (May 12, 1998), U.S. Pat. No. 6,051,678 (Apr. 18, 2000), GB 2,345,286 A (Jul. 5, 2000), U.S. Pat. No. 6,132,926 (Oct. 17, 2000), U.S. Pat. No. 6,143,463 (Nov. 7, 2000), U.S. Pat. No. 6,150,069 (Nov. 21, 2000), U.S. Pat. No. 6,180,316 B1 (Jan. 30, 2001), U.S. Pat. No. 6,225,020 B1 (May 1, 2001), U.S. Pat. No. 6,235,448 B1 (May 22, 2001) and U.S. Pat. No. 6,235,447 B1 (May 22, 2001). Preferably, the acid labile protecting group is selected from the group consisting of t-butyl, tetrahydropyran-2-yl, 2-methyl tetrahydropyran-2-yl, tetrahydrofuran-2-yl, 2-methyl tetrahydrofuran-2-yl, 1-methyoxyproyl, 1-methoxy-1methylethyl, 1-ethoxypropyl, 1-ethoxy-1-methylethyl, 1-methoxyethyl, 1-ethoxyethyl, t-butoxyethyl, 1-isobutoxyethyl and 2-acetylment-1-yl.

Preferably, the photoresist polymer of Formula 1 is poly(t-butyl acrylate/2,2,3,4,4,4-hexafluorobutyl acrylate/maleic anhydride/N-hydroxy-5-norbonene -2,3-dicarboxyimide perfluoro-1-butanesulfonate) represented by the following Formula 1a.

wherein the relative ratio of a:b:c:d is 10:10~30:2~8:2~8 by weight parts.

The photoresist polymer of the present invention further comprises the following Formula 2 as a co-monomer.

[Formula 2]

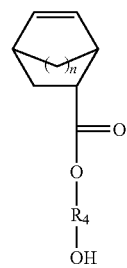

wherein the $R_4$ is linear or branched $C_1$-$C_{10}$ alkylene, and n is an integer ranging from 1 to 2.

The photoresist polymer comprising the Formula 2 comprises a repeating unit represented by the Formula 3.

[Formula 3]

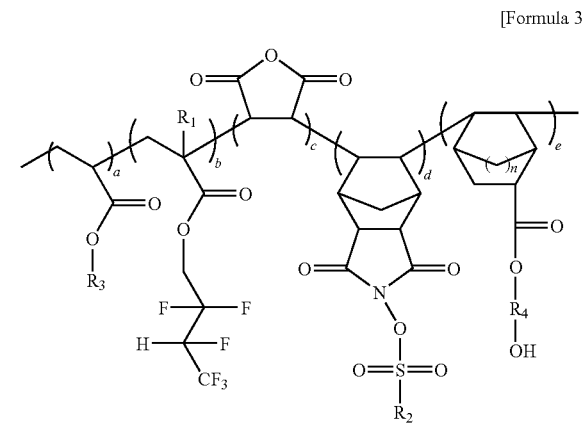

wherein $R_1$ is H or $C_1$-$C_2$ alkyl;

$R_2$ is $C_1$-$C_{10}$ perfluoroalkyl or partially F-substituted $C_1$-$C_{10}$ alkyl;

$R_3$ is an acid labile protecting group;

$R_4$ is linear or branched $C_1$-$C_{10}$ alkylene;

n is an integer ranging from 1 to 2; and the relative ratio of a:b:c:d:e is 10:10~30:2~8:2~8:1~4 by weight parts.

Preferably, the photoresist polymer is poly(t-butyl acrylate/2,2,3,4,4,4-hexafluorobutyl acrylate/maleic anhydride/N-hydroxy-5-norbonene-2,3-dicarboxyimide perfluoro-1-butanesulfonate/2-hydroxyethyl bicycle[2,2,1]hept-5-ene-2-carboxylate) represented by the following Formula 3a.

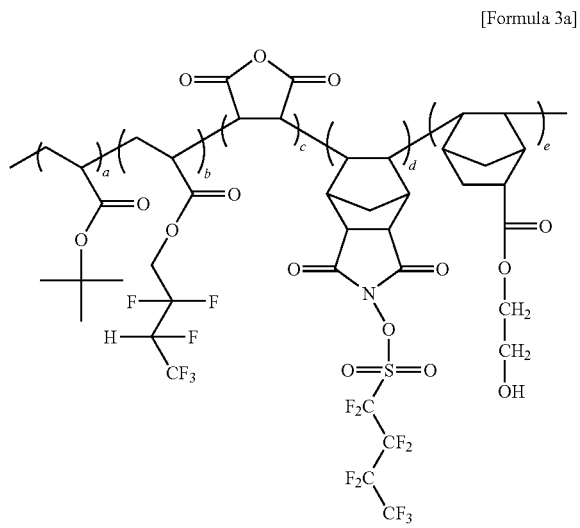

[Formula 3a]

wherein the relative ratio of a:b:c:d:e is 10:10~30:2~8:2~8:1~4 by weight parts.

A photoresist composition includes the photoresist polymer including the polymerization-repeating unit represented by Formula 1 or 3 and an organic solvent to reduce a surface tension.

Preferably, the photoresist composition further includes a basic compound.

The photoresist polymer is preferably present in an amount ranging from 5 to 30 parts by weight, preferably from 5 to 15 parts by weight, based on 100 parts by weight of the photoresist composition. The photoresist film tends to become thinner when the photoresist polymer is present in the amount of less than 5 parts by weight, and the photoresist film tends to become thicker when the photoresist polymer is present in the amount of more than 30 parts by weight, based on 100 parts by weight of the photoresist component.

The monomer units of the polymerization-repeating unit have the following characteristics.

The monomer (a) renders an acid labile protecting group separated by acid generated in the exposure portion while a photoresist film is exposed, thereby developing the exposure portion of the photoresist film in a developing solution.

The monomers (b) and (d) that form the fluorine component reduce the surface tension of the disclosed photoresist composition so that the photoresist film uniformly fills in the spaces between underlying layer patterns.

Moreover, the monomer (d) serves as a photoacid generator and prevents an unexposed portion from being developed while the photoresist film is exposed.

A photoacid generator included as an individual component in the conventional photoresist composition is non-uniformly distributed in the photoresist composition when the photoresist composition is coated. As a result, the unexposed portion of the photoresist film is developed with the small amount of exposure energy. However, when a compound serving as a photoacid generator is included in the repeating unit of the disclosed photoresist polymer, the photoacid generator is uniformly distributed when the photoresist composition is coated so as to prevent the unexposed portion from being developed.

The monomer (c) enhances the polymerization yield of the monomers.

The organic solvent is not specifically limited to dissolve the compounds. Preferably, the organic solvent is selected from those that propyleneglycol methyletheracetate (PGMEA), diethyleneglycol diethyl ether, ethyl 3-ethoxypropionate, methyl 3-methoxypropionate, cyclohexanone, n-heptanone, ethyl lactate, cyclopentanone, and mixtures thereof.

If present, the basic compound is added so that acid generated from the monomer (d) may not be excessively distributed. The basic compound is not specifically limited to those that neutralize acid. Preferably, the basic compound is an amine compound such as triethanol amine. The basic compound is preferably present in an amount ranging from 0.02 to 3.0 parts by weight, preferably 0.2 to 1.0 parts by weight, based on 100 parts by weight of the photoresist composition. The resolution of the photoresist composition tends to degrade when the basic compound is present in the amount of less than 0.02 parts by weight, and the sensitivity of the photoresist composition tends to degrade when the basic compound is present in the amount of more than 3.0 parts by weight.

Since the disclosed photoresist composition comprises the photoresist polymer containing a fluorine component, the surface tension of the photoresist composition is reduced, and easily flows above a glass transition temperature so that it is easy to fill a space between fine patterns.

In addition, there is provided a method for manufacturing a semiconductor device, comprising the steps of:

(i) coating the disclosed photoresist composition on an underlying layer of a semiconductor substrate;

(ii) baking the resultant structure to form a photoresist film;

(iii) exposing the photoresist film to light;

(iv) baking the exposed photoresist film;

(v) developing the resultant structure of step (iv) to obtain a first photoresist pattern; and (vi) etching the lower underlying layer using the first photoresist pattern as an etching mask to form an underlying layer pattern.

Also, there is provided a method for manufacturing a semiconductor device, further comprising the steps of:

(vii) removing the first photoresist pattern;

(viii) coating the disclosed photoresist composition on the whole surface of the resultant structure of step (vii) to form a flattened photoresist film which fills the underlying layer pattern; and (ix) performing an exposure process and a developing process on the resultant structure of step (viii) using an ion-implanting mask to form a second photoresist pattern.

The foregoing method may further include a baking process step either before the exposure process or after the exposure process of the step (ix).

An ion-implanting process may be performed using the second photoresist pattern as a mask so as to improve electric characteristics after step (ix).

FIGS. 4a through 4d are diagrams illustrating a method for manufacturing a semiconductor device to form a pattern for an ion-implanting process using a disclosed photoresist composition.

Figure 4A:
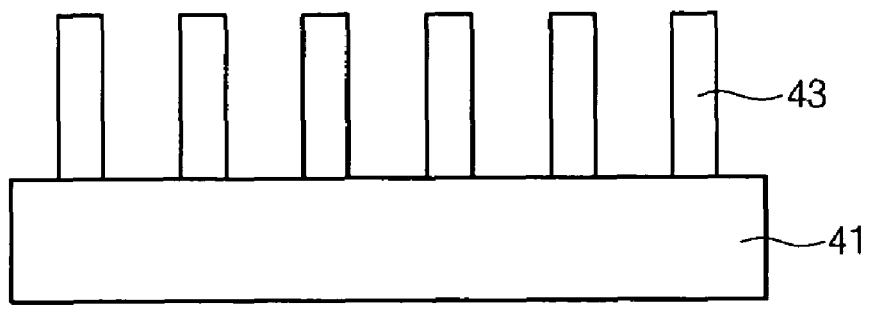
FIGS. 4a through 4d are diagrams illustrating a method for manufacturing a semiconductor device to form a pattern for an ion-implanting process using a disclosed photoresist composition.

Referring to FIG. 4a, an underlying layer (not shown) is formed on a semiconductor substrate 41, and a first photoresist pattern (not shown) is formed thereon by using exposure and developing process.

The first photoresist pattern is preferably formed by using a photoresist material selected from the group consisting of novolak resins, acrylate compounds, polymers of cyclo-olefin monomers and maleic anhydrides and combinations thereof.

Thereafter, an underlying layer pattern 43 is formed by etching process with the first photoresist pattern (not shown) as a mask. The width of the underlying layer pattern preferably ranges from 10 nm to 150 nm, and the space width between the patterns preferably ranges from 10 nm to 150 nm.

The resultant structure is precipitated in an aqueous TMAH (tetramethylammonium hydroxide) solution to remove the first photoresist pattern.

Figure 4B:
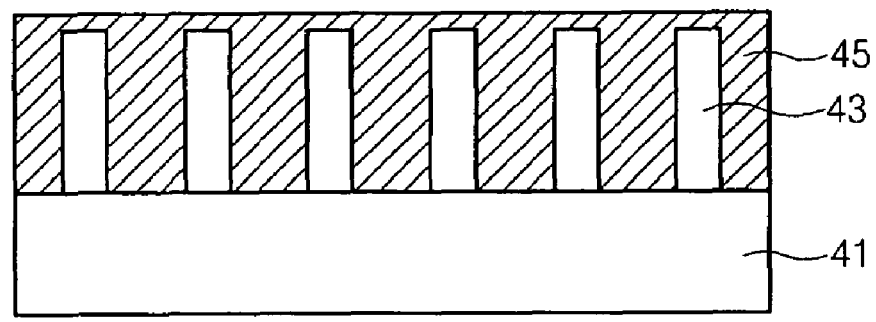

As shown in FIG. 4b, the photoresist composition is spin-coated on the whole surface including the underlying layer pattern 43 of FIG. 4a to form a uniformly filled photoresist film 45 in the space between underlying layer patterns 43.

The photoresist film is preferably formed at a thickness ranging from 50 nm to 800 nm, highly preferably from 100 nm to 300 nm from the substrate.

Figure 4C:
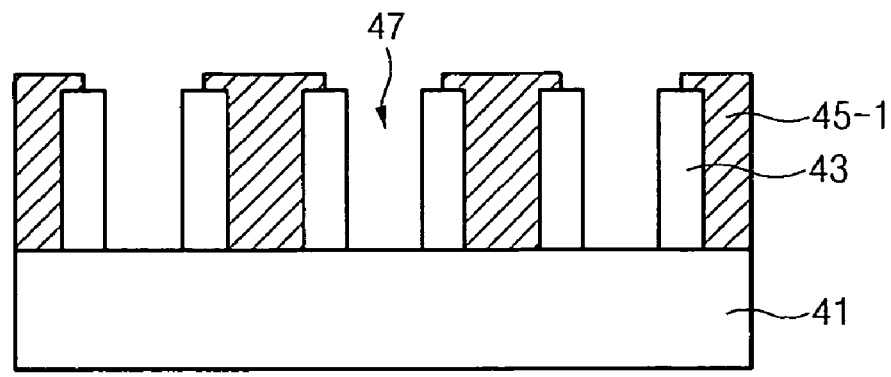

After the photoresist composition is coated, the baking process is further performed, preferably at a temperature ranging from 130° C. to 180° C., highly preferably from 150° C. to 160° C. above a glass transition temperature for a time period preferably ranging from 100 seconds to 150 seconds, highly preferably 110 seconds to 130 seconds:

An exposure and developing process is performed on the photoresist film 45 formed in FIG. 4b to form a second photoresist pattern as shown in FIG. 4c. The second photoresist pattern has an open portion 47 and a portion 45-1 filled with photoresist alternately between the underlying layer patterns 43.

The light is preferably one of KrF, ArF, EUV (Extreme Ultra Violet), VUV (Vacuum Ultra Violet), E-beam, X-ray or ion-beam, and the exposure process is preferably performed at an exposure energy ranging from about 0.1 mJ/cm$^2$ to about 100 mJ/cm$^2$.

The developing process is performed with an alkali developing solution which is preferably tetramethylammonium hydroxide (TMAH) aqueous solution of about 0.01 wt % to about 5 wt %.

Figure 4D:
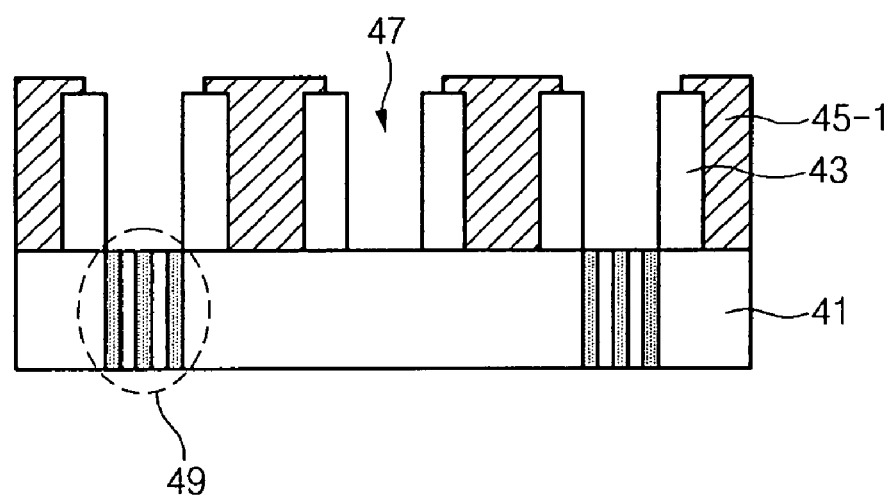

Thereafter, the ion-implanting process is performed on the open portion 47 with the photoresist pattern of FIG. 4c as a mask for ion-implanting process to form an ion-implanting region 49 as shown in FIG. 4d.

The ion-implanting process is preferably performed with ions such as Br ion and BF$_2$ ion at 50 KeV and dose=2×10$^{13}$.

The exposure and developing process is performed on the whole surface resultant structure of FIG. 4d to remove the remained photoresist pattern as a mask. As a result, semiconductor device 41 where an ion-implanting region 49 is formed alternately in the underlying layer pattern is obtained.

In addition, there is provided a semiconductor device manufactured by using the disclosed method.

EXAMPLES

The disclosed compositions will be described in detail by referring to examples below, which are not intended to limit the present invention.

I. Preparation of a Photoresist Polymer and Photoresist Composition

Example 1

Preparation of a Photoresist Polymer (1)

Figure 3:
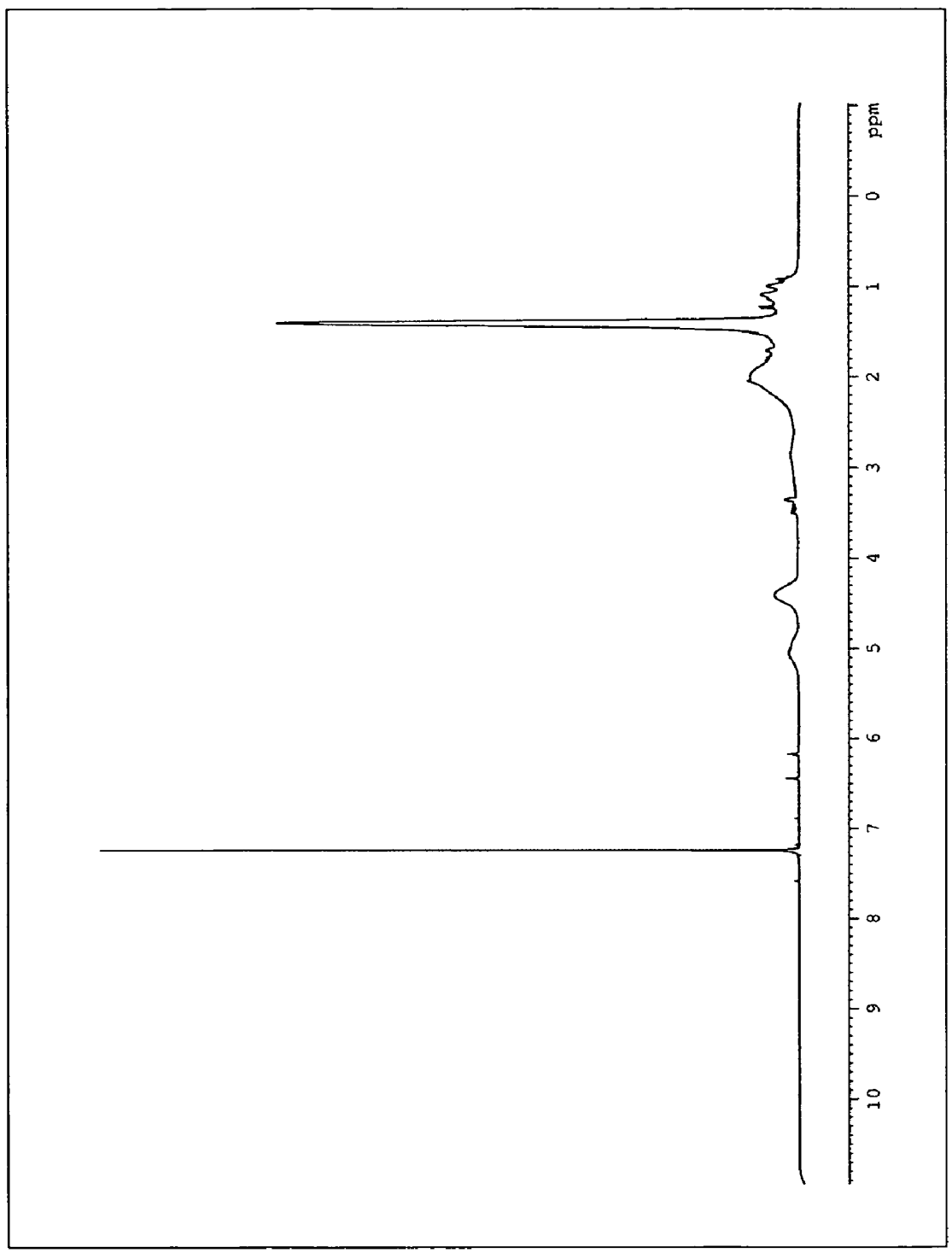
FIG. 3 is a NMR spectrum illustrating a polymer obtained from Example 1.

To tetrahydrofuran (THF) (600 g) were added t-butyl acrylate (77.7 g), 2,2,3,4,4,4-hexafluorobutyl acrylate (Aldrich, CAS No. 54052-90-3) (87.5 g), maleic anhydride (24.5 g), N-hydryoxy-5-norbonene-2,3-dicarboxyimide perfluoro-1-butanesulfonate (Aldrich, CAS No. 307531-76-6) (22.25 g) and 2,2'-azobisisobutylronitrile (AIBN) (14.84 g). Then, the resulting mixture was stirred at 66° C. for 12 hours. After the polymerization reaction, n-hexane was added to form the precipitation. The precipitation is dehydrated to obtain the polymer of Formula 1a (103 g, yield: 49%) (see NMR of FIG. 3).

The analysis of NMR on the polymer of Formula 1a:
$^1$H NMR 1.5 ppm (—C(CH$_3$)$_3$), 4~5 ppm (—CHF—)

Example 2

Preparation of a Photoresist Polymer (2)

To tetrahydrofuran (THF) (600 g) were added t-butyl acrylate (77.7 g), 2,2,3,4,4,4-hexafluorobutyl acrylate (Aldrich, CAS No. 54052-90-3) (87.5 g), maleic anhydride (24.5 g), N-hydryoxy-5-norbonene-2,3-dicarboxyimide perfluoro-1-butanesulfonate (Aldrich, CAS No. 307531-76-6) (22.25 g), 2-hydroxyethyl bicycle[2,2,1]hept-5-ene-2-carboxylate(15 g) and 2,2'-azobisisobutylronitrile (AIBN) (14.84 g). Then, the resulting mixture was stirred at 66° C. for 12 hours. After the polymerization reaction, n-hexane was added to form the precipitation. The precipitation is dehydrated to obtain the polymer of Formula 3a (103 g, yield: 67%)

Example 3

Preparation of a Photoresist Composition (1)

To PGMEA (180 g) was dissolved the polymer (10 g) obtained from Example 1 and triethanol amine (0.024 g). Then, the resulting mixture was filtered with a 0.01 μm filter to obtain the disclosed photoresist composition.

Example 4

Preparation of a Photoresist Composition (2)

To PGMEA (180 g) was dissolved the polymer (10 g) obtained from Example 2 and triethanol amine (0.024 g). Then, the resulting mixture was filtered with a 0.01 μm filter to obtain the disclosed photoresist composition.

II. Planarization of a Photoresist Composition

Experimental Example 1

A contact hole having a diameter of 0.2 μm and a depth of 0.8 μm was filled with the photoresist composition obtained from Example 3 by a spin-coating method of 1200 rpm, and baked at 140° C. for 90 seconds to obtain a uniform photoresist film without a void.

Experimental Example 2

A contact hole having a diameter of 0.2 μm and a depth of 0.8 μm was filled with the photoresist composition obtained from Example 4 by a spin-coating method of 1200 rpm, and baked at 140° C. for 90 seconds to obtain a uniform photoresist film without a void.

III. Ion-Implanting Process Method

Example 5

(5-1) Formation of the Underlying Layer Pattern

Figure 5:
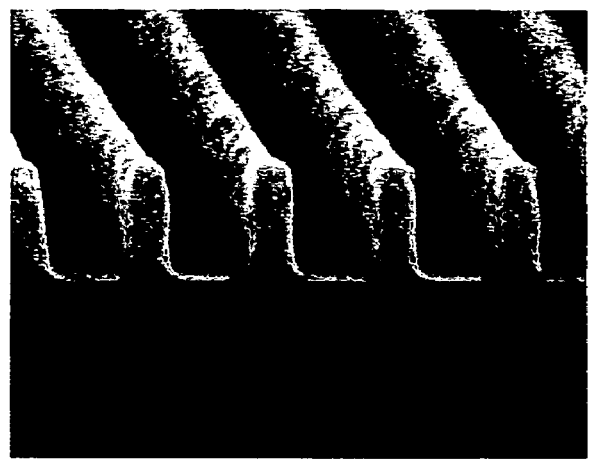
FIG. 5 is a photograph illustrating a photoresist pattern obtained from Example 3.

An underlying layer was formed on a silicon wafer treated with HMDS (hexamethyl disilazane), and the disclosed photoresist composition obtained from Example 2 was spin-coated thereon and soft-baked at about 130° C. for about 90 seconds to form a photoresist film at 3,500 Å. After soft-baking, the photoresist film was exposed to light using an ArF laser exposer, and post-baked at about 130° C. for about 90 seconds. After post-baking, it was developed in 2.38 wt % tetramethylammonium hydroxide (TMAH) aqueous solution for about 30 seconds, to obtain the 110 nm photoresist pattern (see FIG. 5). The underlying layer is etched with the photoresist pattern as a mask to form the underlying layer pattern.

(5-2) Ion-Implanting Process

Figure 6:
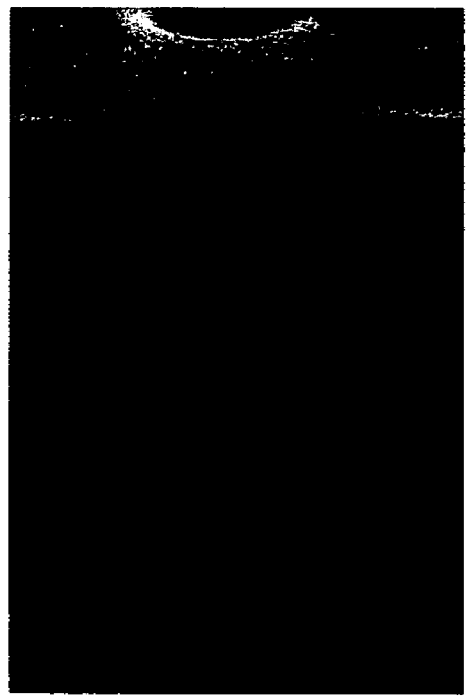
FIG. 6 is a SEM photograph illustrating of a photoresist film uniformly filled in a space between underlying layer patterns obtained from Example 3.

The photoresist pattern obtained from Example 3-1 is removed by the aqueous TMAH solution to expose the underlying layer pattern. The disclosed photoresist composition obtained from Example 3 was spin-coated on the underlying layer pattern and was soft-baked at about 140° C. for about 90 seconds to form a uniformly filled photoresist film in the space between underlying layer patterns at 2,000 Å (see FIG. 6)

The exposure and developing process was performed on the photoresist film to form 80 nm photoresist pattern having an open portion and a portion filled with photoresist alternately between underlying patterns. Then, Br ions were implanted on the open portion with the photoresist pattern as a mask by an intermediate implanting process of 50 KeV and Dose=$2 \times 10^{13}$. After the ion-implanting process, the exposure and developing process was performed on the resultant structure to remove the remained photoresist pattern as a mask.

As a result, a semiconductor substrate including 0.08 μm L/S underlying pattern where an ion-implanting region is alternately formed is manufactured.

Example 6

The procedure of Example 5 was repeated using the photoresist composition of Example 4 instead of the photoresist composition of example 3 to obtain the 0.08 μm L/S underlying pattern where an ion-implanting region is alternately formed is manufactured.

As described above, a uniform photoresist pattern that has no voids can be obtained with the disclosed photoresist composition having reduced surface tension, so that a subsequent ion-implanting process is stably performed to improve the yield of semiconductor devices.

What is claimed is:

1. A photoresist polymer comprising a polymerization-repeating unit represented by Formula 1 and a co-monomer represented by Formula 2:

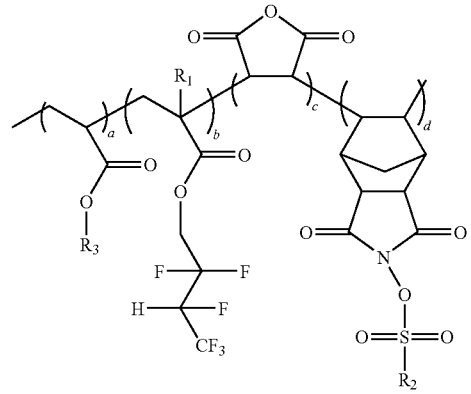

[Formula 1]

wherein $R_1$ is H or $C_1$-$C_2$ alkyl;
$R_2$ is $C_1$-$C_{10}$ perfluoroalkyl or partially F-substituted $C_1$-$C_{10}$ alkyl;
$R_3$ is t-butyl; and
the relative ratio of a : b : c : d is 10 : 10~30 : 2~8 : 2~8 by weight parts;

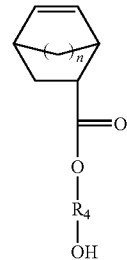

[Formula 2]

wherein the $R_4$ is linear or branched $C_1$-$C_{10}$ alkylene, and n is an integer ranging from 1 to 2.

2. The photoresist polymer of claim 1, wherein the photoresist polymer comprises a polymerization repeating unit represented by Formula 3:

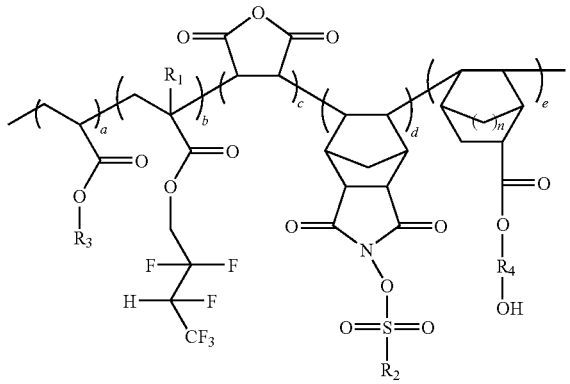

[Formula 3]

wherein $R_1$ is H or $C_1$-$C_2$ alkyl;
$R_2$ is $C_1$-$C_{10}$ perfluoroalkyl or partially F-substituted $C_1$-$C_{10}$ alkyl;

$R_3$ is t-butyl;

$R_4$ is linear or branched $C_1$-$C_{10}$ alkylene;

n is an integer ranging from 1 to 2; and the relative ratio of a : b : c : d : e is 10 :10~30 : 2~8 : 2~8 : 1~4 by weight parts.

3. The photoresist polymer of claim 2, wherein the repeating unit is the following formulas 3a:

[Formula 3a]

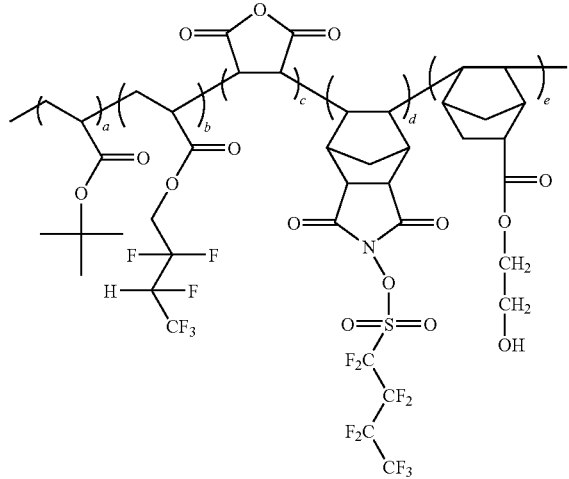

wherein the relative ratio of a : b : c : d : e is 10 : 10~30 : 2~8 2~8 : 1~4 by weight parts.

4. A photoresist composition comprising a photoresist polymer of claim 1 and an organic solvent.

5. The photoresist composition of claim 4, wherein the photoresist polymer is present in an amount ranging from 5 to 30 parts by weight based on 100 parts by weight of the photoresist composition.

6. The photoresist composition of claim 5, wherein the photoresist polymer is present in an amount ranging from 5 to 15 parts by weight based on 100 parts by weight of the photoresist composition.

7. The photoresist composition of claim 4, wherein the organic solvent is selected from the group consisting of propyleneglycol methyletheracetate, diethyleneglycol diethylether, ethyl 3-ethoxypropionate, methyl 3-methoxypropionate, cyclohexanone, n-heptanone, ethyl lactate, cyclopentanone, and mixtures thereof.

8. The photoresist composition of claim 4, further comprising a basic compound.

9. The photoresist composition of claim 8, wherein the basic compound is triethanol amine.

10. The photoresist composition of claim 8, wherein the basic compound is present in an amount ranging from 0.02 to 3.0 parts by weight based on 100 parts by weight of the photoresist composition.

11. The photoresist composition of claim 10, wherein the basic compound is present in an amount ranging from 0.2 to 1.0 parts by weight based on 100 parts by weight of the photoresist composition.

* * * * *